(12) United States Patent
Li

(10) Patent No.: US 9,405,336 B1
(45) Date of Patent: Aug. 2, 2016

(54) SILENT COMPUTERS HAVING EXTERNAL HEAT SINKS AND PORTABLE RAID DOCKS

(71) Applicant: Qingyuan Li, Beijing (CN)

(72) Inventor: Qingyuan Li, Beijing (CN)

( * ) Notice: Subject to any disclaimer, the term of this patent is extended or adjusted under 35 U.S.C. 154(b) by 0 days.

(21) Appl. No.: 14/852,495

(22) Filed: Sep. 12, 2015

(51) Int. Cl.
  *G06F 1/20* (2006.01)
  *H05K 7/20* (2006.01)
  *G06F 1/18* (2006.01)
  *G06F 7/20* (2006.01)

(52) U.S. Cl.
  CPC ...... *G06F 1/20* (2013.01); *G06F 1/182* (2013.01); *G06F 1/184* (2013.01); *G06F 1/185* (2013.01); *G06F 1/187* (2013.01); *G06F 1/188* (2013.01); *G06F 7/20* (2013.01)

(58) Field of Classification Search
  None
  See application file for complete search history.

(56) References Cited

U.S. PATENT DOCUMENTS

| | | | | |
|---|---|---|---|---|
| 7,139,170 B2* | 11/2006 | Chikusa | ........ | G06F 1/20 165/122 |
| 7,643,281 B2* | 1/2010 | Okamoto | ........ | G11B 33/126 360/69 |
| 7,911,788 B2* | 3/2011 | Sasagawa | ........ | G06F 1/20 165/104.34 |
| 7,933,120 B2* | 4/2011 | Tanaka | ........ | H05K 7/20727 312/223.2 |
| 7,965,502 B2* | 6/2011 | Miyamoto | ........ | G06F 1/187 312/236 |
| 8,416,571 B2* | 4/2013 | Mizumura | ........ | H05K 7/20836 361/679.48 |
| 8,755,176 B2* | 6/2014 | Davis | ........ | G11B 33/128 361/601 |
| 2004/0039745 A1* | 2/2004 | Evans | ........ | G06F 17/30607 |
| 2004/0160720 A1* | 8/2004 | Yamanashi | ........ | G06F 1/20 361/103 |
| 2008/0192431 A1* | 8/2008 | Bechtolsheim | ........ | H05K 7/20727 361/695 |
| 2011/0090633 A1* | 4/2011 | Rabinovitz | ........ | G06F 1/184 361/679.31 |
| 2014/0218858 A1* | 8/2014 | Shelnutt | ........ | G06F 1/206 361/679.31 |
| 2015/0106560 A1* | 4/2015 | Perego | ........ | G06F 12/10 711/105 |

\* cited by examiner

*Primary Examiner* — Courtney Smith

(57) ABSTRACT

The present disclosure provides silent computers having external heat sinks, which rarely turns on mechanical fans. The silent computers could utilize common components to keep lower costs, or be customized to improve cooling efficiency. The present disclosure also provides portable RAID docks to multiple whole IOPS performance of storage system.

4 Claims, 15 Drawing Sheets

SILENT COMPUTERS HAVING EXTERNAL HEAT SINKS AND PORTABLE RAID DOCKS

FIELD OF INVENTION

The present invention relates, in general, to methods and devices to be utilized in silent computers.

BACKGROUND OF INVENTION

Conventional computers are very noisy devices. The main source of the noise generated is the cooling fan in the computer housing. The noise of the airflow and the mechanical vibration of the fan form a main part of the loud noise, which is highly undesirable.

The noise emitted by a personal computer in either a home or office is distracting and annoying, and can have negative effects on the productivity of the users. Also, the loud noise can interfere with activities such as listening to music or sleeping.

Liquid cooling systems are getting more and more popular. But it is too expensive (even more expensive than most CPU) to be everyone's choice. And the price is not the only problem, once the tubes failed and leaked the cooling solution, it could result in electrical shorts and irreparable internal damage. And the liquid cooling systems are still noisy because it requires pump to circulate the liquid.

What is needed is an operable computer with lowest use of mechanical fans or pumps. Such a computer would be expected to operate quieter, to be more compact than current models, and to have enhanced reliability without any substantial cost penalty.

Such a computer is described in U.S. Pat. No. 5,671,120, in which one side of the housing is configured to be a cooling body. But it is not the face (of motherboard) with CPU installed being mounted to the cooling body, so the heat sink will not have direct contact with high thermal dissipating object. It is not efficient for cooling.

U.S. Pat. No. 8,582,298 B2 shows a computer with two sides of the housing configured to be cooling bodies. But it is designed for data center. It requires a customized motherboard to fit around the heat pipes. It could utilize only two smaller faces around the PCB (Printed Circuit Board) to install heat sinks because of high-density server environment.

U.S. Pat. No. 6,867,985 B2 shows a passively cooled computer with cooling ribs pointing outwards. A motherboard is arranged in between cooling ribs, with processor and hard disk drives being pressed against one of the cooling bodies. It is not easy to increase storage volume, because the hard disk drives are coupled with the processor and the cooling bodies.

U.S. Pat. No. 7,072,179 B1 describes a computer with integrated display. The back side of the housing is configured to be a cooling body. But the heat sink is enclosed in a closed box and it is not efficient to dissipate the waste heat.

SUMMARY OF INVENTION

Problems of the Prior Art

A typical ATX computer case includes both 5.25" and 3.5" bays, which make the chassis very cumbersome. But the mini computer cases do have limitations on the size of heat sink.

A typical graphics card is installed perpendicularly to the motherboard PCB (Printed Circuit Board), which limits the height of the heat sink on graphics card to less than a couple of PCI slots.

A typical DC power supply for laptop or mini desktop computer requites an external AC adapter, which occupies extra space and increases clutter.

A typical RAID dock is designed to replace the fault drive easily. It has multiple power and data cables, which is not convenient to plug in and out all RAID drives at once frequently.

An ordinary SATA connector only has a design-life of 50 matings. It will be a serious problem when the SATA connectors could not mate someday. Unlike bad sectors, it is almost impossible to access the data electronically, not to mention recovering it.

Therefore, in accordance with all embodiments of the invention there are provided devices comprising:

A computer housing to allow most parts of heat pipes in heat sink(s) to stick out of the computer enclosure, or utilizing customized heat sink(s) as one or more biggest face(s) of the housing to make cooling body or cooling bodies;

Adapter cable(s) to allow the PCB(s) of graphics card(s) to be installed parallel to the PCB of motherboard, which are optional if user need more GPU(s) than core graphics;

An AC power supply unit (PSU) integrated with forementioned external heat sink, which is optional if more power supply is required by extra graphics card(s);

An external dock to provide portable RAID dock, which could be adapted to any types of mass storage interface (such as SATA, Mini-SATA/mSATA, M.2/NGFF, eSATA, SATA Express, etc);

Extra mating dock to be mounted on RAID drives, which is replaceable when its' design-life of matings depleted;

It should be understood, however, that this summary may not contain all aspects and embodiments of the present invention, that this summary is not meant to be limiting or restrictive in any manner, and that the invention as disclosed herein will be understood by one of ordinary skill in the art to encompass obvious improvements and modifications thereto.

BRIEF DESCRIPTION OF DRAWINGS

In accordance with common practice, the various described features are not drawn to scale and are drawn to emphasize features relevant to the present disclosure. Like reference characters denote like elements throughout the figures and text.

DETAILED DESCRIPTION

Figure 1:
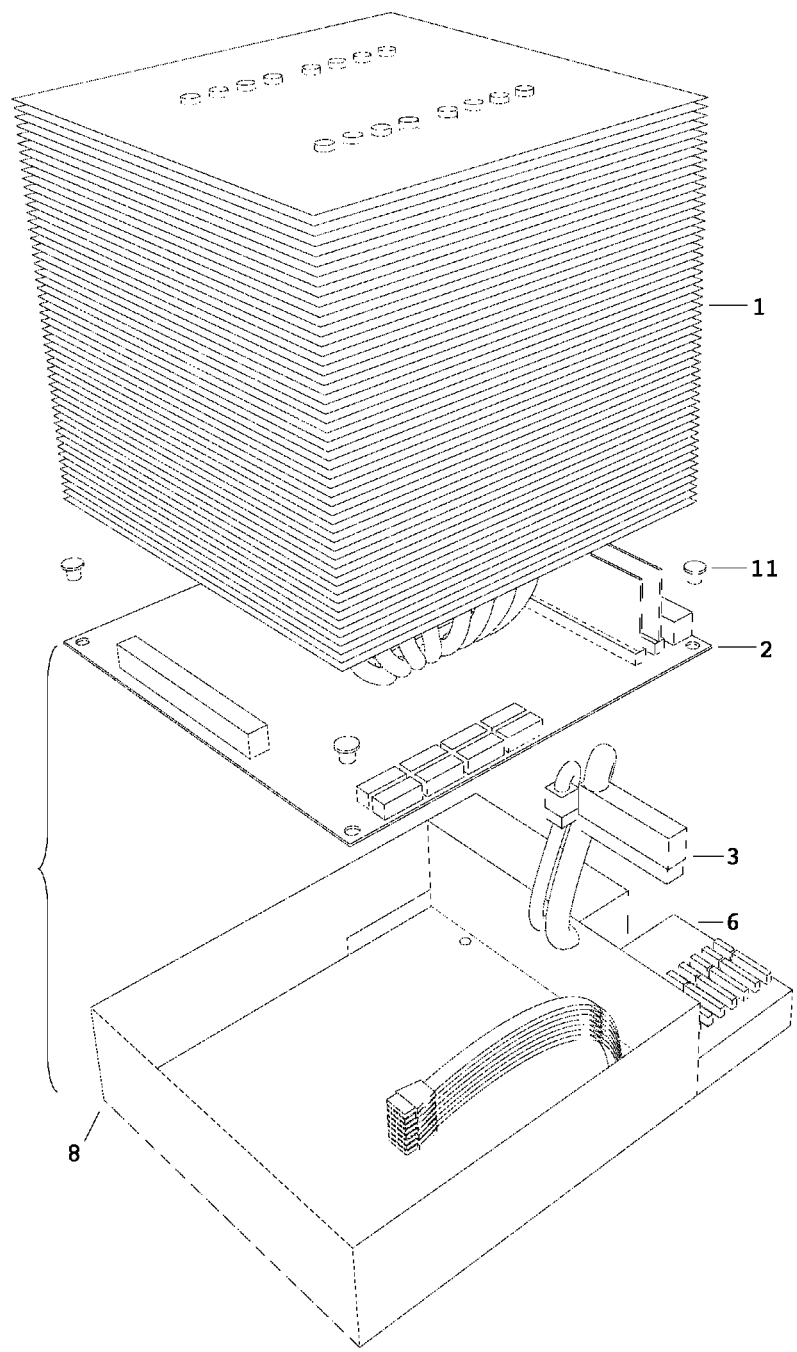
FIG. 1 is one exploded view of one exemplary embodiment of the present invention, having external heat pipes and fins.
Figure 2:
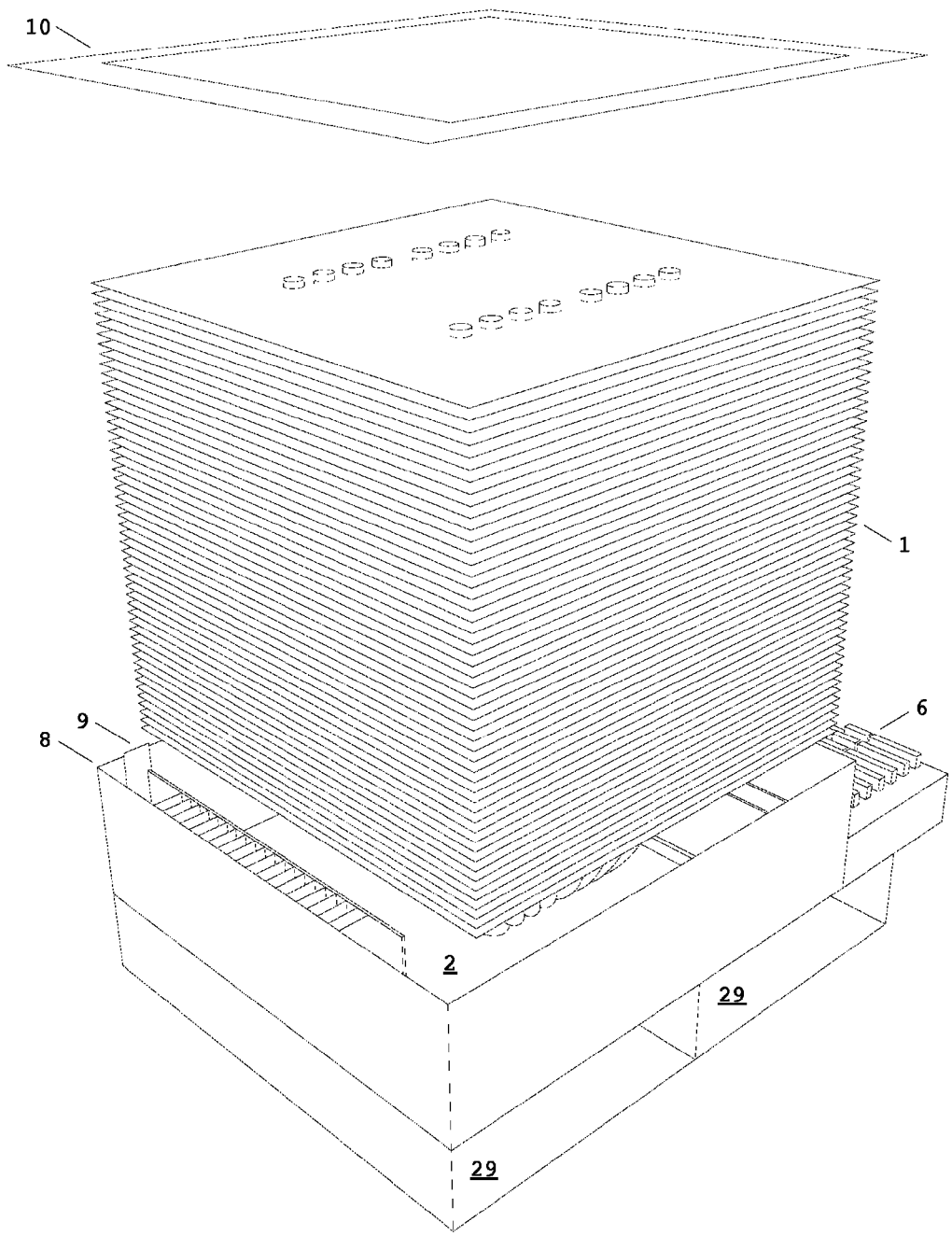
FIG. 2 is one exploded view of another exemplary embodiment of FIG. 1, which shows how a top cover would be utilized to enclose electronic components with computer case, and optional hard disk drive (HDD) bays.
Figure 3:
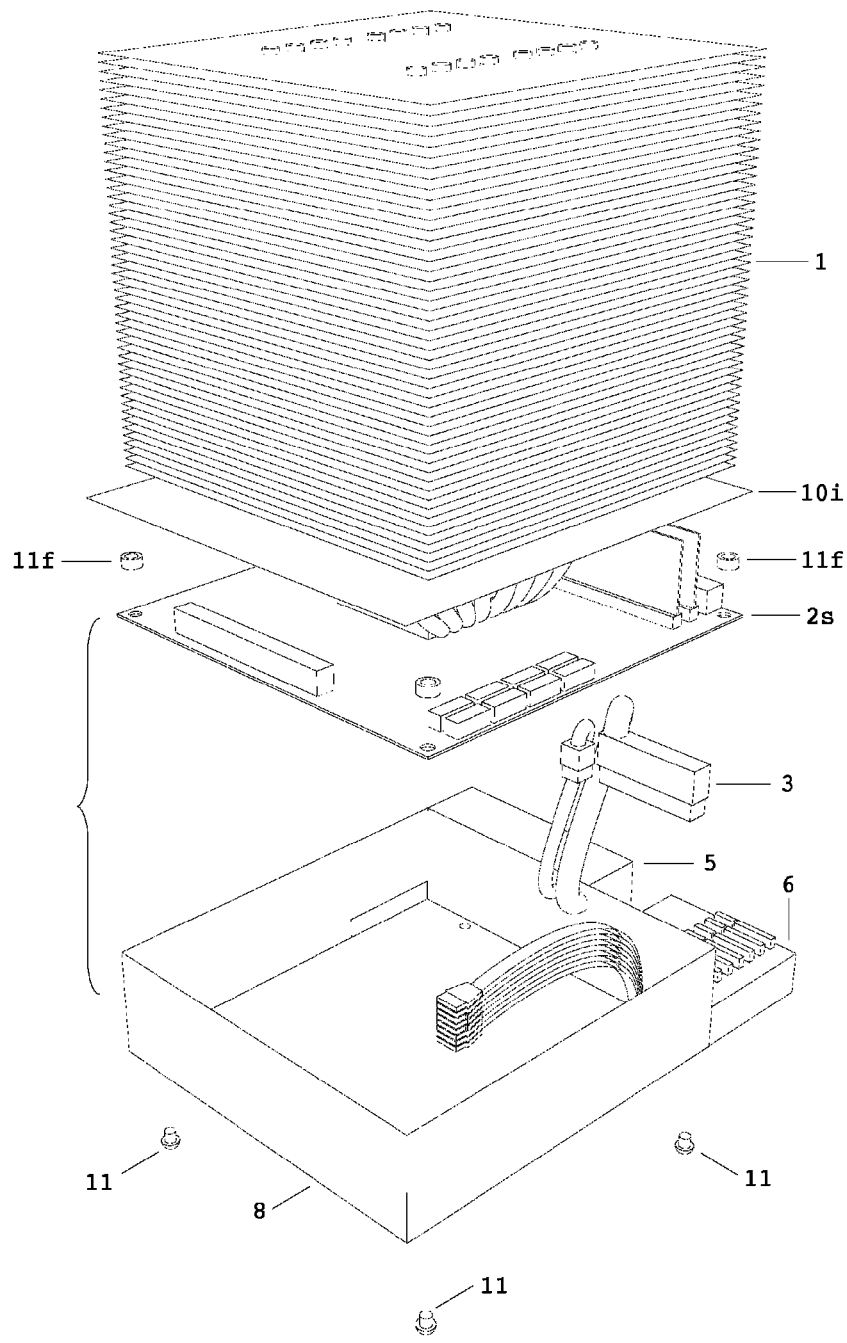
FIG. 3 is one exploded view of yet another exemplary embodiment of FIG. 1, which shows how a top cover integrated on heat sink would be utilized to enclose electronic components with computer case.
Figure 4:
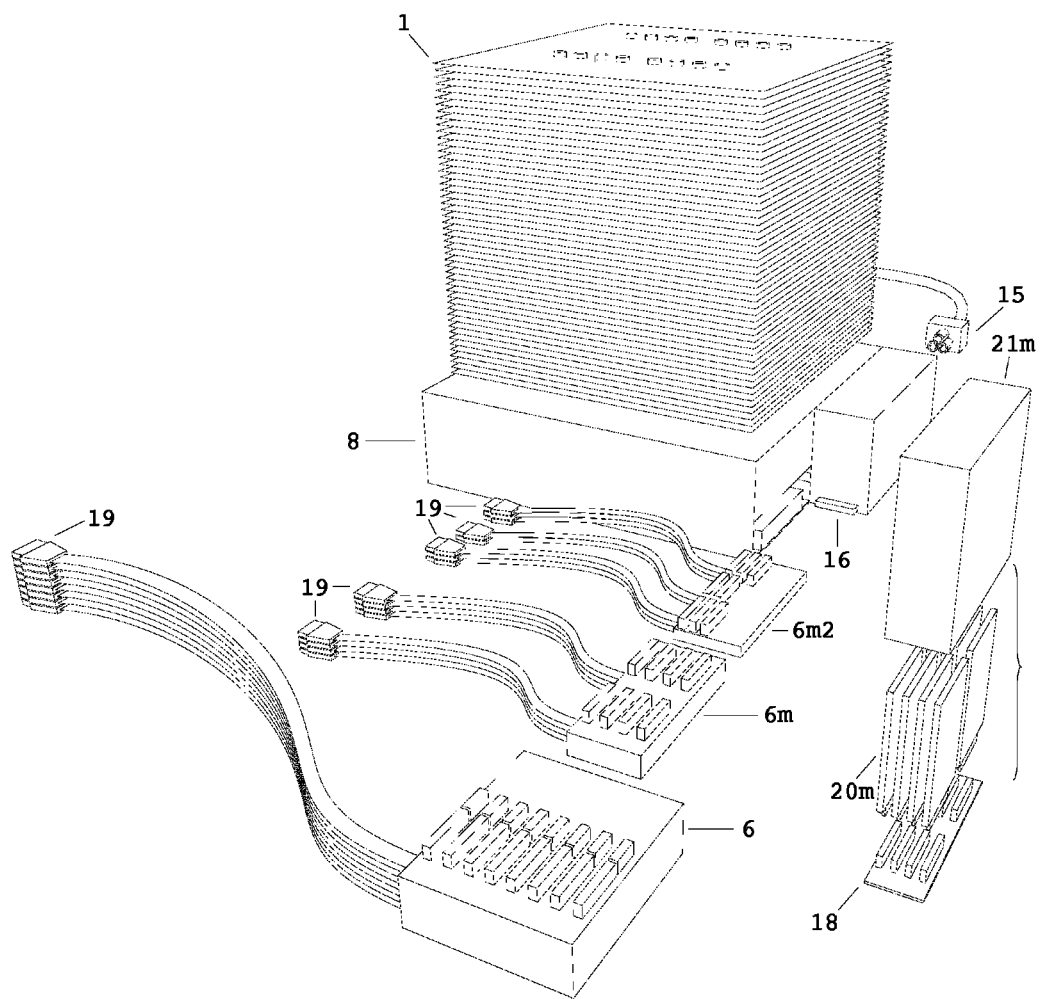
FIG. 4 is another exploded view of the exemplary embodiment of FIG. 1, which shows adaptable RAID docks with various kinds of mass storage interface (SATA, mSATA, M.2/NGFF), mSATA RAID drives, mSATA RAID case and replaceable mating dock.
Figure 5:
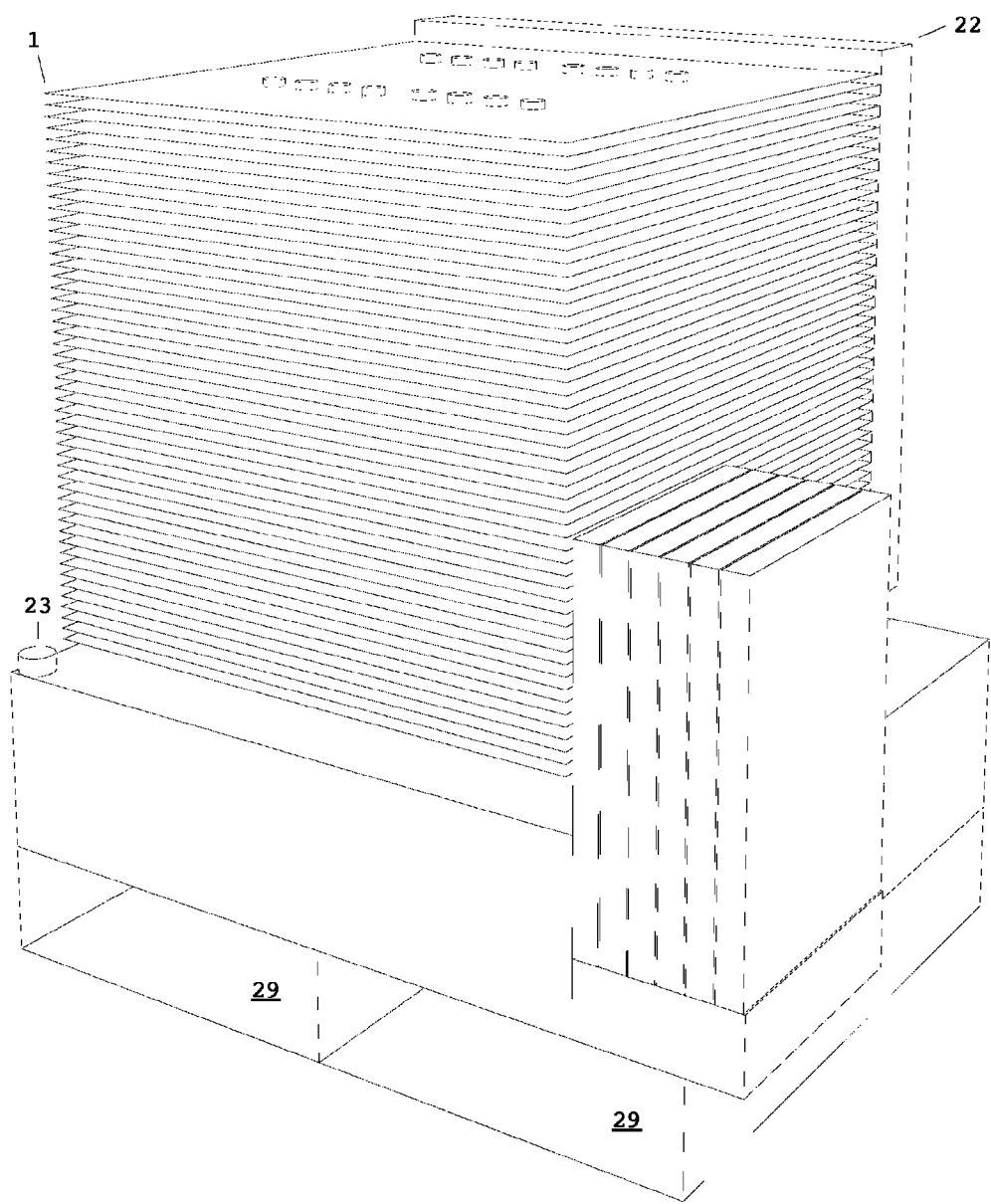
FIG. 5 is one perspective view of the exemplary embodiment of FIG. 2, which shows optional cooling fan and cooling fan switch/regulator, and optional hard disk drive (HDD) bays.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present invention.

It will be understood that various changes can be made in the function and arrangement of elements without departing from the spirit and scope as set forth in the appended claims. Accordingly, an embodiment is an example or implementation of the inventions and not the sole implementation. Various appearances of "one embodiment," "an embodiment" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention can also be implemented in a single embodiment or any combination of embodiments.

Reference in the specification to "one embodiment", "an embodiment", "some embodiments" or "other embodiments" means that a particular feature, structure, or characteristic described in connection with the embodiments is included in at least one embodiment, but not necessarily all embodiments, of the inventions. It is to be understood that where the specification states that a component feature, structure, or characteristic "may", "might", "can" or "could" be included, that particular component, feature, structure, or characteristic is not required to be included.

Reference to terms such as "left", "right", "top", "bottom", "front" and "back" are intended for use in respect to the orientation of the particular feature, structure, or element within the figures depicting embodiments of the invention. It would be evident that such directional terminology with respect to the actual use of a device has no specific meaning as the device can be employed in a multiplicity of orientations by the user or users.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the embodiments of the present invention in conjunction with the accompanying drawings in FIG. 1 to 15. Reference will be made to the drawing figures to describe the present invention in detail, wherein depicted elements are not necessarily shown to scale and wherein like or similar elements are designated by same or similar reference numeral through the several views and same or similar terminology.

ATX specification was developed by Intel in 1995. It was the first major change in desktop computer enclosure, motherboard and power supply design for 20 years. But after floppy disk drive (FDD) has been obsolete in early 21st century, and optical disc drive (ODD) has been almost superseded by USB flash drives and cloud storages, and solid-state drive (SSD) has been starting to replace hard disk drive (HDD), conventional ATX computer case with multiple 5.25" and 3.5" bays looks more and more unnecessary cumbersome. It is time to make another major change for desktop computers.

This trend has been started by Apple Mac mini and Intel NUC (Next Unit of Computing). Unfortunately, for these small form factor (SFF) desktop computer, the trade-off is that hardware specifications and processing power are usually reduced and hence make them less appropriate for running complex, resource-intensive applications.

In addition, SFF computers are very hard to be extended, for instance, when a user want to utilize all SATA connectors that southbridge or ICH (named by Intel) or FCH (named by AMD) chip supports, to multiple whole Input/Output Operations Per Second (IOPS) performance of storage system.

To summarize, these SFF desktop computers are designed to minimize the volume of a desktop computer. They are not designed to eliminate noise. SFF are usually quieter just because they consume much less power and produce much less performance and much less heat. SFF will never make mainstream desktop computers under the current state of the art.

Water-cooling is currently the most effective and potentially quietest method of cooling. But except for the forementioned risk of which tubes fail and leak the cooling solution, special precaution must be taken for possibility to create condensation when a water-cooled heat sink becomes below ambient temperature. This may, in fact, create the risk of frying a motherboard, graphics card, hard disk drive or other components inside the water-cooled computer system. Again, it is expensive (more expensive than most CPU) and a great technical challenge to set up (due to the number of components and case modification usually required), water-cooling is mostly utilized by over-clockers.

What is needed is a passive cooled computer having mainstream performance, so the key is to increase surface areas of heat sink(s) and improve the heat dissipation efficiency.

Meanwhile, even for a full-sized ATX computer case, the max height of heat sink on CPU is mostly limited to about the width of 5.25" bays. The first object of the present invention is to remove this limitation, which will be introduced below.

Heat sinks are typically aluminum and have fins that extend from the base. Fins extend the areas of the heat sink to allow more contact area for cooling air. Fins allow air to flow through the heat sink to enable more heat to be removed from the heat sink. Depending on fin spacing and geometry, the fins can be cooled in natural convection mode, driven by the buoyancy effects of air as it heats with respect to gravity; or through forced air cooling, such as the case of fans blowing cool air through the heated fin surface areas. The fins can be made of aluminum or copper, for example, and/or may be enhanced with graphite fibers. Heat can be spread between fins through soil base materials such as copper, but can be enhanced through the use of heat pipes.

A heat pipe is a component which aids in removing heat away from the heat sink. It transfer heat from one point to another. Often referred to as a superconductor, a heat pipe possesses extraordinary heat transfer capacity and rate with almost no heat loss. A heat pipe is made of an aluminum or copper container, and the container comprises inner surfaces having a capillary wicking material. Heat pipes utilize phase change within a closed container, where heat is vaporized at the evaporator section near the high thermal dissipating object, and condensed in the condenser section near the cooling fins. Liquid within the heat pipe then returns to the evaporator section through gravity assist, or more typically, via a wick material.

Products utilizing computer cases as passive cooling bodies, have been on the market for years, for example: Streacomm FC5/FC8/FC9/FC10 (ALPHA) fan-less chassis. However, heat pipes are enclosed inside these computer cases, which limit the best Thermal Design Power (TDP) of CPU to about 35 W. And because of difficulties of manufacturing fins with computer cases, those fan-less computer cases are too expensive to be prevalent.

What is needed is to utilize heat sink as part of computer enclosure, not the opposite.

FIG. 1 to 5 shows simplest and the most affordable exemplary embodiment of the present invention. It does not require customized motherboard (e.g. standard Mini-ITX motherboard 2 is applicable). It applies common ATX power connectors 3. A top cover 10 (looks like a square ring) will be installed from the top of heat sink 1 (FIG. 2) to enclose all electronic components within computer case 8, after all the other components have been assembled together.

In another case (FIG. 3), it only requires motherboard 2s to put CPU on the center or other specific position on (and as a generic specification should be followed by) motherboard. So that the top cover 10i, which is integrated on heat sink, could finally enclose all electronic components within computer case 8. Another limitation is that the screw nuts 11f must be glued onto, nailed into, heated bonded with, or attached by any other means to the motherboard 2s in advance, so that the motherboard 2s could be fixed into computer case 8 by screw bolts 11.

Power supply unit (PSU) 5 applies AC input 15 directly. It comprises an AC adapter which converts AC power to one single DC voltage, and a DC converter to supply the various DC voltages required by other computer components. Unlike laptop or mini desktop computers, it does not need any external AC adapter (sometimes referred to as a "power brick" due to its similarity, in size, shape and weight, to a real brick). The trade-off of these fan-less PSU is that they usually have a bit lower wattage ratings, but it is enough for mainstream CPU/GPU.

PCI Express (PCIe) based SSD usually has higher (million level) IOPS than SATA based SSD (ten thousands level), but it is much more expensive per unit of storage than SATA SSD because of complications to design SSD controller. And meanwhile, most desktop computers spend most of their time lightly loaded. It is naturally thought to utilize software RAID to multiple whole IOPS performance of storage system.

RAID dock 6 comprises a female power connector which could connect to PSU male power connector 16, multiple data connectors 19 which could connect to female data connectors on motherboard 2/2s, and multiple storage data/power connector pairs on a base.

An extra protective mating dock 18, which is replaceable when design-life of matings were depleted, is designed to be mounted on portable RAID drives. A protective case 21m is utilized to hold and enclose SATA SSD RAID drives or mSATA SSD RAID drives 20m.

RAID dock 6 itself is replaceable, too. It could be easily adapted to any kinds of mass storage interface (such as mSATA, M.2/NGFF, eSATA, eSATAp, SATA Express, NVMe/NVMHCI with adapter cables connect to PCIe, etc), as shown as 6m, 6m2.

Half-height graphics card 9 or other expansion cards could be supported in this motherboard-sized computer case.

An optional cooling fan 22 could be turned on by optional manual switch/regulator 23 for hours of compute intensive tasks, such as source code compiling, video encoding, computer graphics (CG) rendering, etc. Embodiments of the invention, however, are not limited to the use of manual switch/regulator. For example, manual switch/regulator could be working with automatic switch/regulator controlled by thermal sensor and/or Operation System (OS), so that users could have fully control on noise generated from mechanical fans, and meantime without losing the benefits of "lazy mode".

Optional hard disk drive (HDD) bays 29 are kept to provide cheaper storages.

Figure 6:
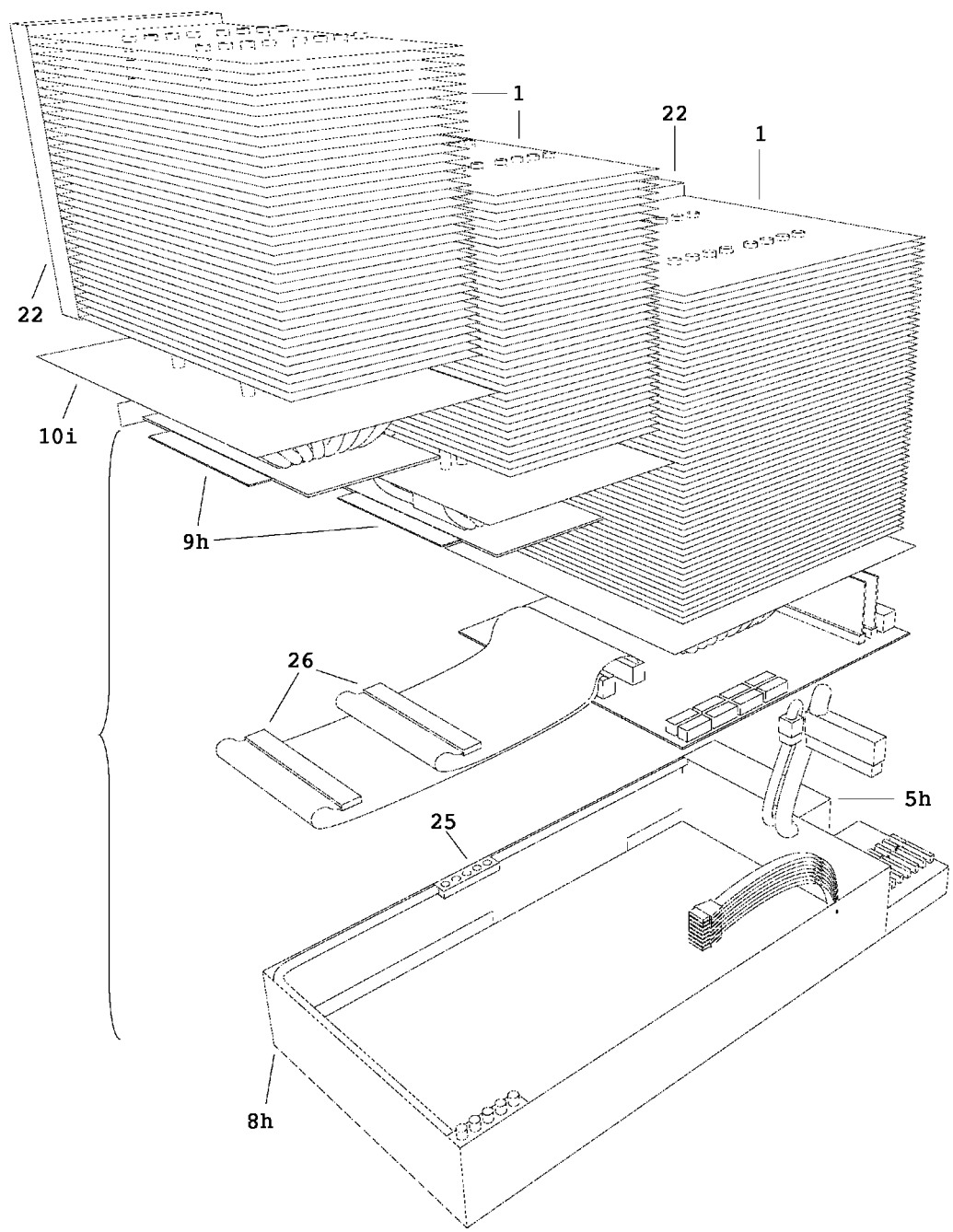
FIG. 6 is one exploded view of varietal exemplary embodiment of FIG. 1, with extra dual graphics cards installed parallel to the PCB of motherboard, optional cooling fans and cooling fan switches/regulators.
Figure 7:
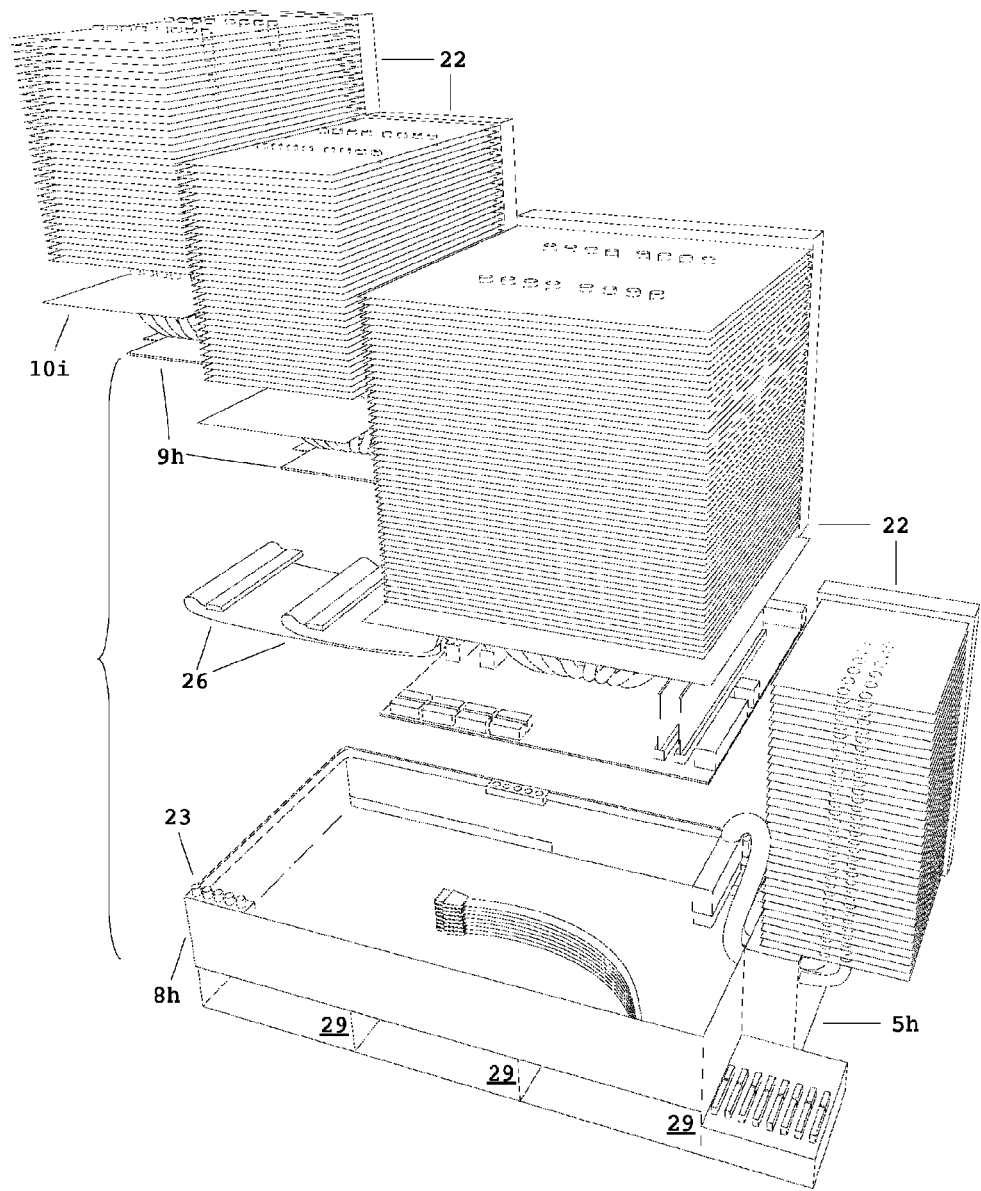
FIG. 7 is one exploded view of another exemplary embodiment of FIG. 6, which shows an external heat sink on power supply unit (PSU), and optional hard disk drive (HDD) bays.

FIGS. 6 and 7 shows a varietal exemplary embodiment of FIG. 1 to 5, which is designed to support extra graphics card or graphics cards 9h in silent computers. As same as FIG. 1 to 5, there are two methods to enclose all electronic components: regular top covers (look like square rings), or integrated (on heat sinks) top covers 10i.

An adapter cable or adapter cables 26 could be utilized to convert the plane of graphics card or the planes of graphics cards to be installed parallel to the plane of motherboard and the plane of computer case 8h, to allow larger heat sink(s) installed on graphics card(s).

Fan power sockets 25 are utilized to provide electric power for cooling fans 22. As same as FIG. 1 to 5, cooling fans 22 could be turned on by manual switches/regulators 23, or work with automatic switches/regulators for hours of compute intensive tasks (such as gaming).

PSU 5h is equipped with extra large heat sink to provide plenty of electric power for extra graphics cards 9h. As same as the heat sinks on CPU/GPU, most parts of heat pipes and all fins on the heat sink stick out of the computer enclosure.

Figure 8:
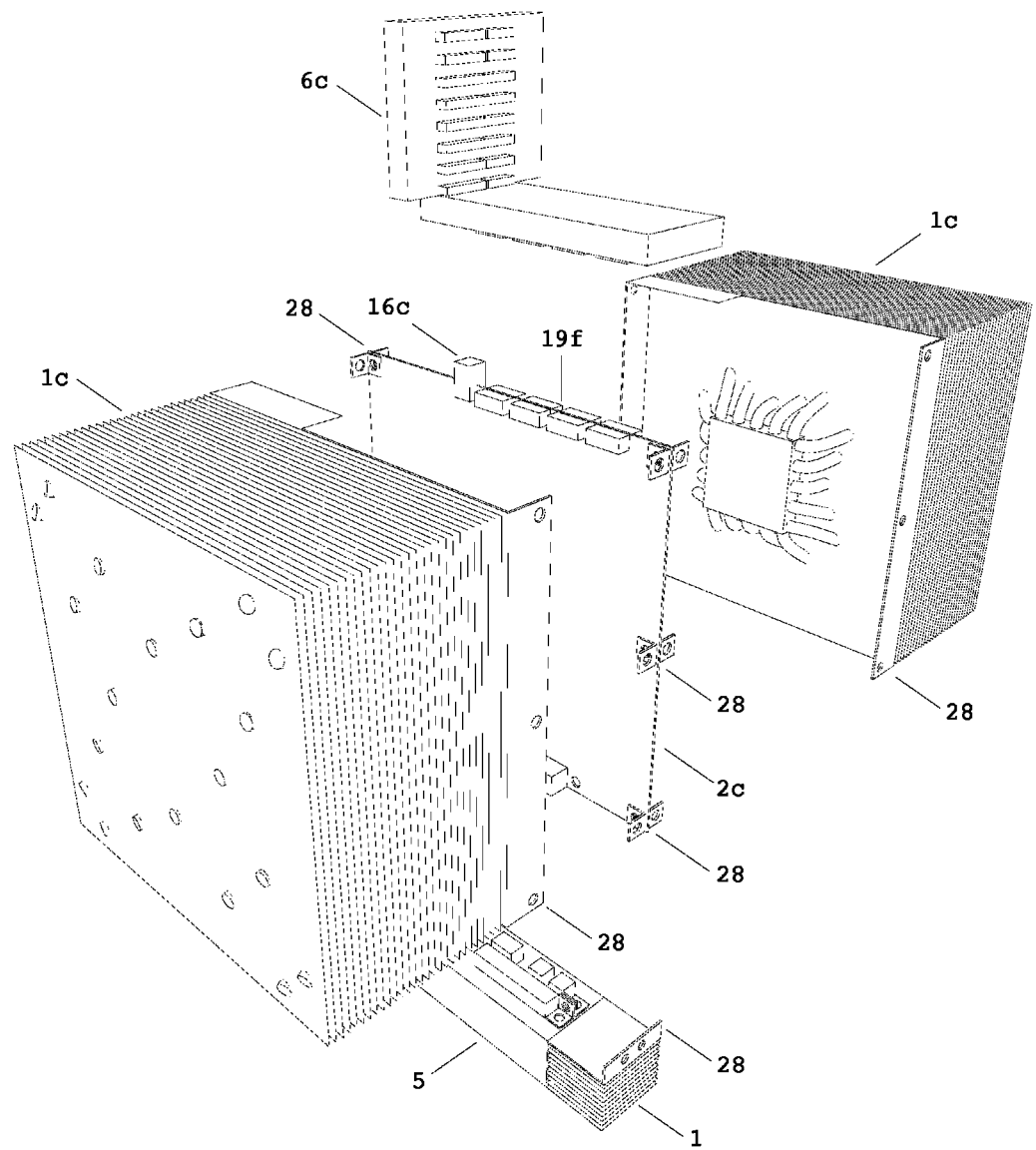
FIG. 8 is one exploded view of the second exemplary embodiment of the present invention, which shows how customized motherboard with CPU and GPU put on both sides of PCB plane, utilizes two biggest faces of the computer housing to make cooling bodies.
Figure 9:
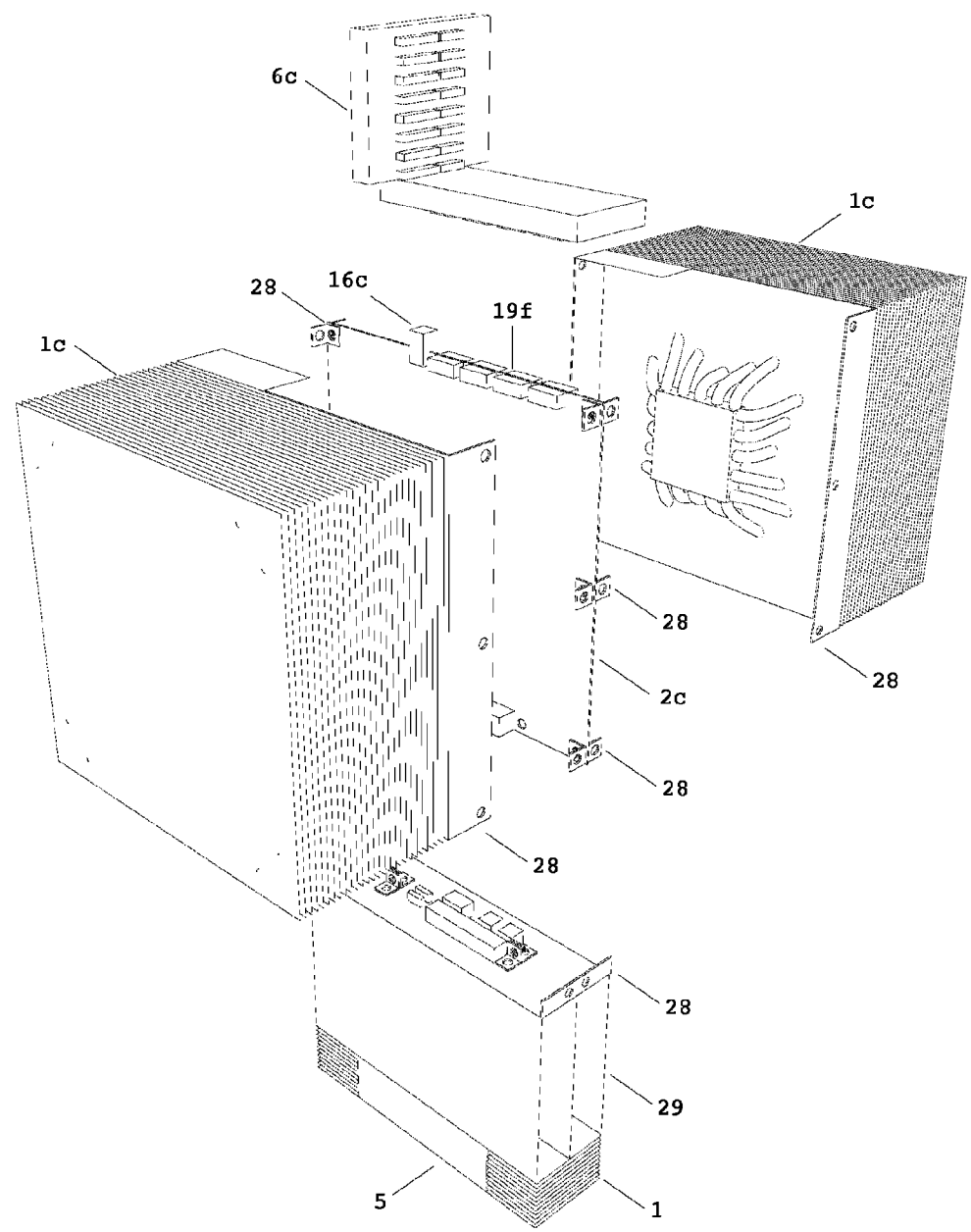
FIG. 9 is one exploded view of another exemplary embodiment of FIG. 8, having optional hard disk drive (HDD) bays.
Figure 10:
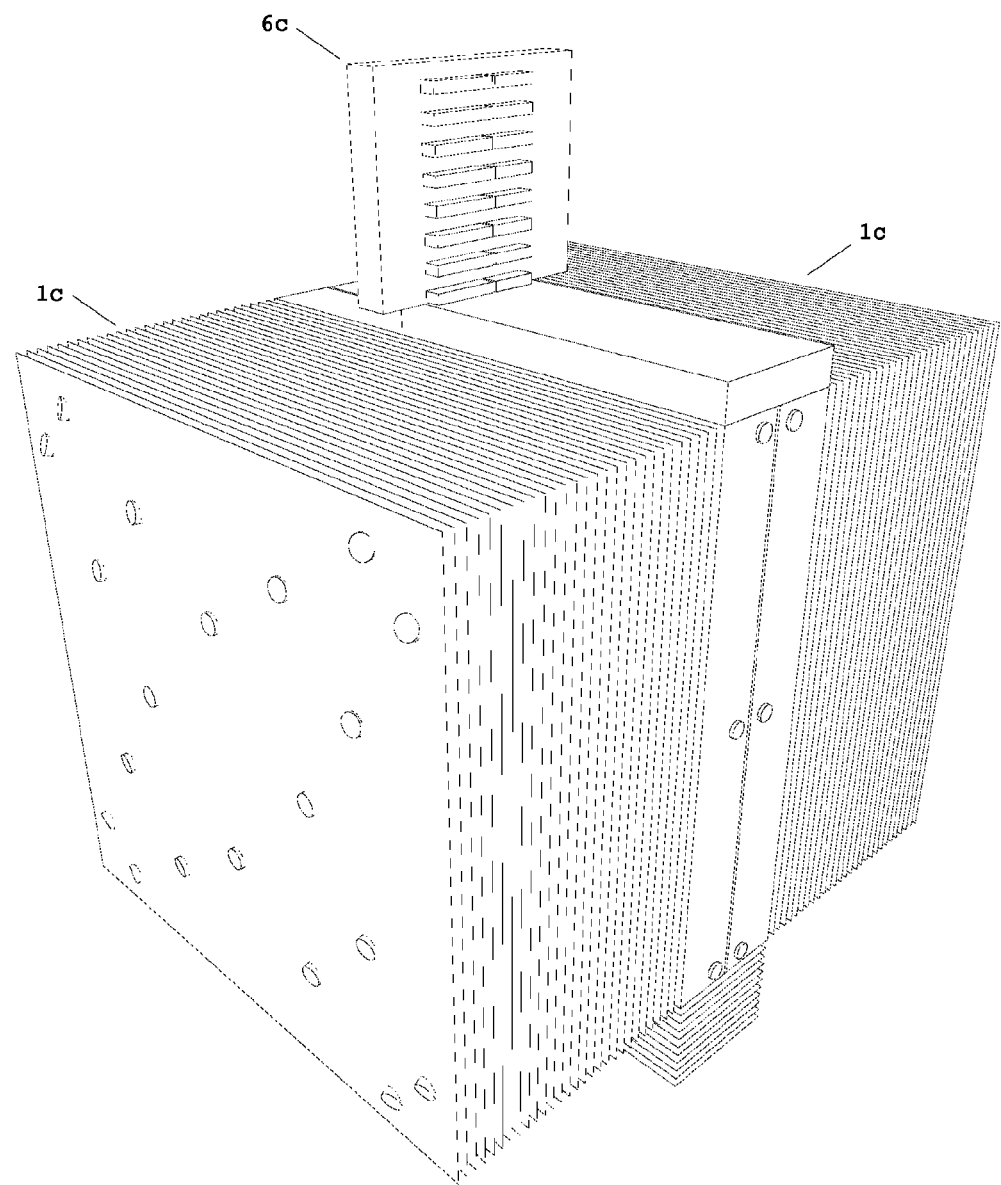
FIG. 10 is one perspective view of the exemplary embodiment of FIG. 8.

FIG. 8 to 10 shows the second exemplary embodiment of the present invention, which requires customized motherboard 2c, with CPU and GPU put on both sides of motherboard PCB plane, to utilize two biggest faces of the computer housing to make cooling bodies 1c, which are customized heat sinks to match the positions of CPU/GPU on motherboard 2c with the positions of the bases of heat sinks 1c.

RAID dock 6c comprises a female power connector which could connect to customized male power connector 16c on motherboard 2c, multiple data connectors which could connect to female data connectors 19f on motherboard 2c, and multiple storage data/power connector pairs on a base.

In described embodiments of the invention, screw holes 28 are utilized to fixate heat sinks 1c with customized motherboard 2c and PSU 5. Embodiments of the invention, however, are not limited to the use of screw holes 28. For example, other structures like metal frames (not shown), could be designed to protect PCB of motherboard 2c from distortion by gravity of customized heat sinks 1c, and guarantee close contact between CPU/GPU and the customized heat sinks.

Figure 11:
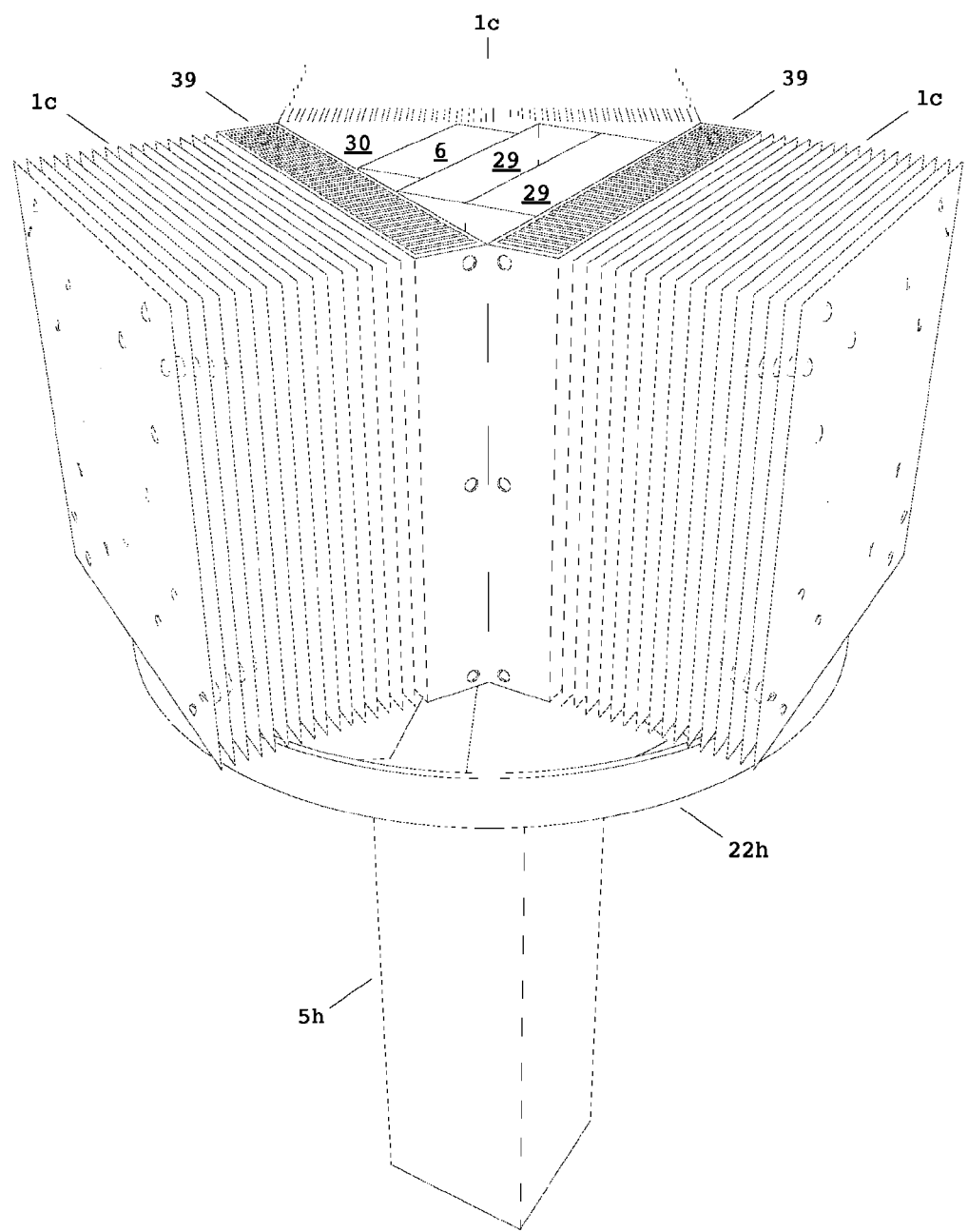
FIG. 11 is one perspective view of the third exemplary embodiment of the present invention, which shows a silent computer having multiple graphics cards and a large joint cooling fan.

FIG. 11 shows the third exemplary embodiment of the present invention. It is the customized version of FIGS. 6 and 7. As similar as shown in FIGS. 8 and 9, customized motherboard, customized graphics cards and customized heat sinks 1c will be required to match the positions of CPU/GPU with the positions of the bases of customized heat sinks 1c.

Customized motherboard and customized graphics cards, which are enclosed by different customized heat sinks and metal backplanes 30, will be joined to form the shape of prism. As similar as shown in FIGS. 6 and 7, adapter cables (not shown) will be utilized to connect the customized graphics cards to PCIe slots on the customized motherboard.

Figure 12:
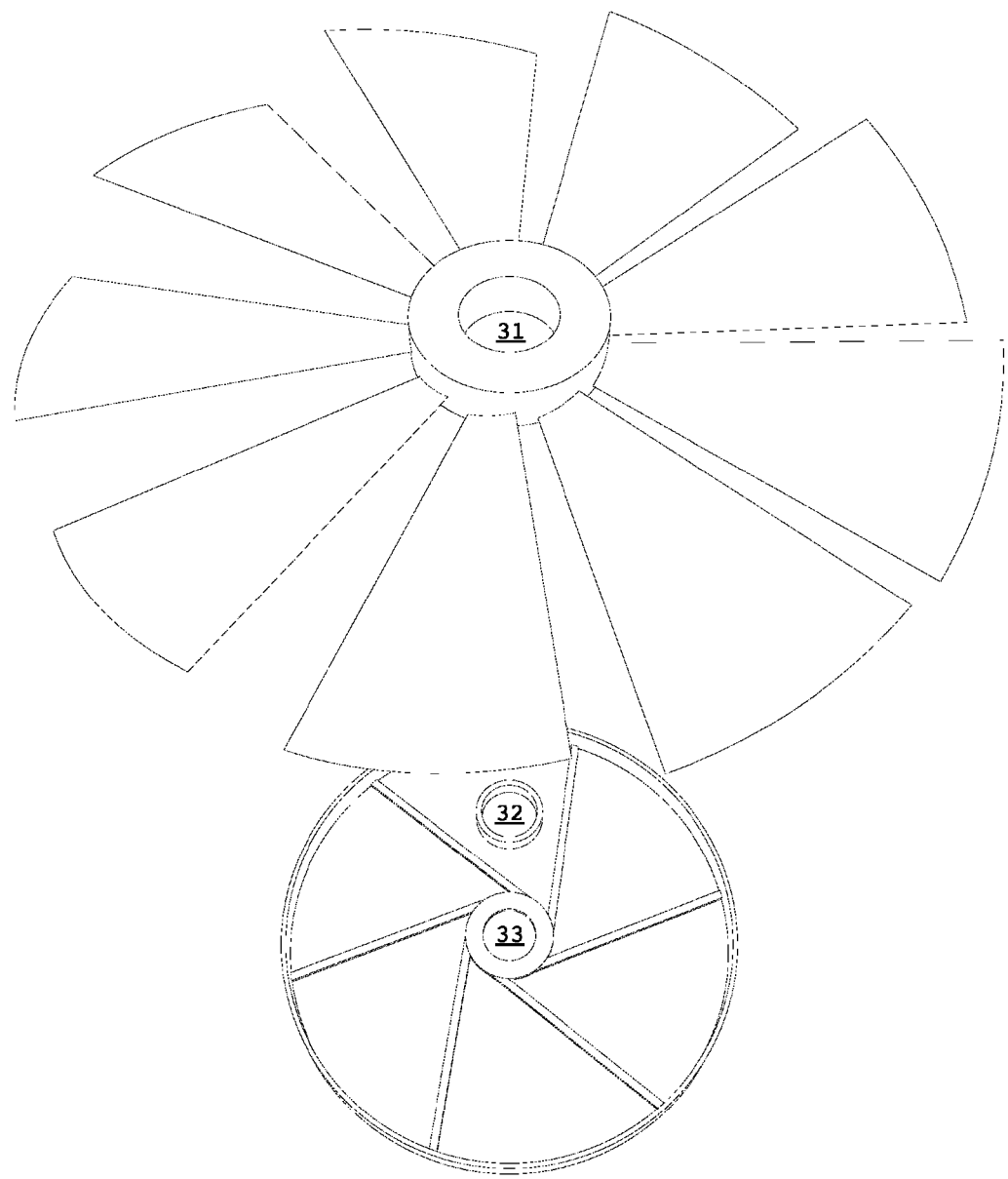
FIG. 12 is one exploded view of the exemplary embodiment of the joint cooling fan in FIG. 11, which comprises a cooling fan, a fan axle, a fan motor base and protective frame.

A large joint cooling fan 22h is designed to cool all high thermal dissipating objects (CPU, GPU, PSU) simultaneously, whenever compute intensive tasks are started. As shown in FIG. 12, the joint fan 22h comprises a cooling fan 31, a fan axle 32, a fan motor base and protective frame 33. All listed components (31/32/33) each has a hole in the center to let data/power cables get through and connect upper components (such as motherboard, graphics cards, RAID drives, optional HDD bays) with PSU 5h to reduce clutter and improve airflow. All I/O ports from the motherboard and the graphics cards, such as USB, Displayport, HDMI, Ethernet NIC (network interface controller), audio, will be redirected to one face or two faces of the PSU 5h by fore-mentioned data cables.

PSU 5h is equipped with large heat sink to make higher wattage rating. Unlike other "mainstream" exemplary embodiments of the present invention, exemplary embodiment of FIGS. 11 and 12 is built for "performance" computers or even "enthusiast" computers. Higher wattage rating is one basic requirement.

Meanwhile, most desktop computers spend most of their time lightly loaded, even for those "performance" computers or "enthusiast" computers. Passive cooling is perfectly competent for lightly loaded CPU/GPU/PSU. Once the compute intensive tasks started, as same as other exemplary embodiments of the present invention, joint cooling fan 22h would be turned on by manual switches/regulators, or be working with sensor and/or operation system (OS) controlled automatic switches/regulators.

RAID dock 6 and optional HDD bays 29 will be put inside the prism which is formed by the customized motherboard and the customized graphics cards.

Ventilation holes 39 are well distributed over other smaller faces of the customized heat sinks 1c around the PCB planes of motherboard and graphics cards, especially the top ones to make better air passage and great ventilation.

Figure 13:
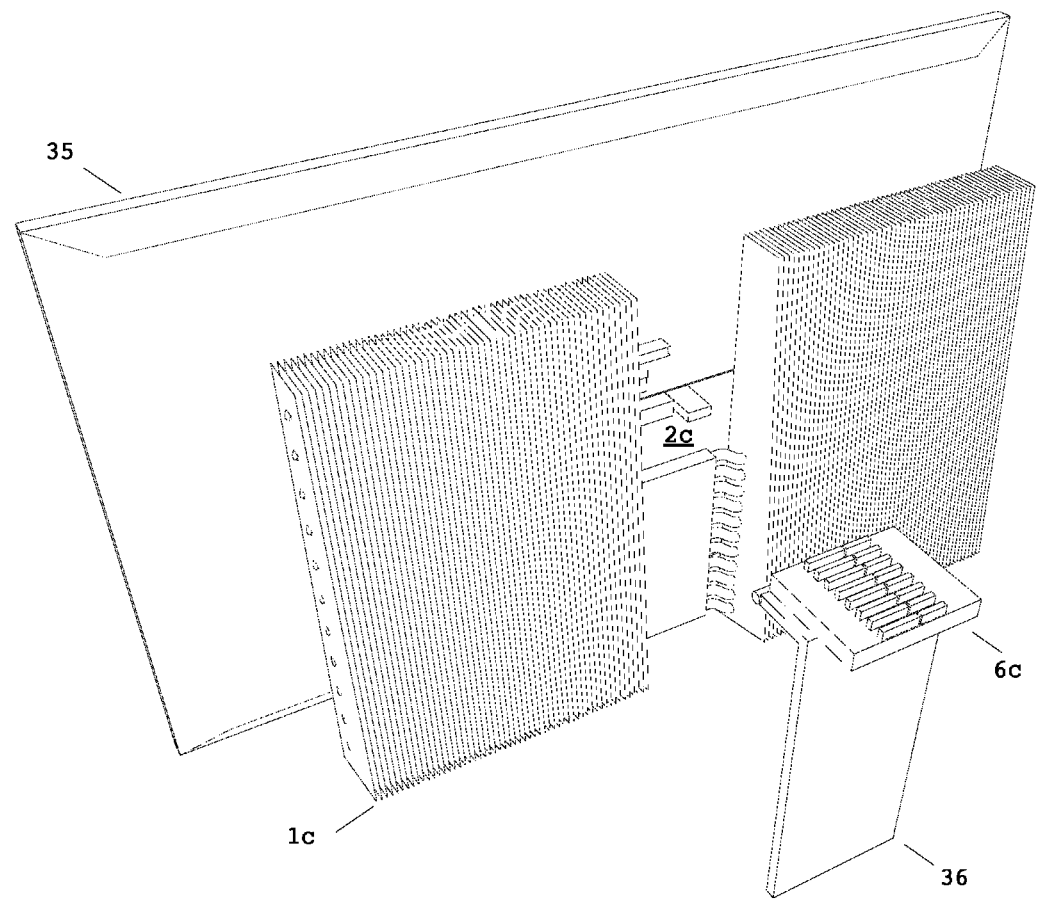
FIG. 13 is one exploded view of the All-in-One (AIO) exemplary embodiment of the present invention.
Figure 14:
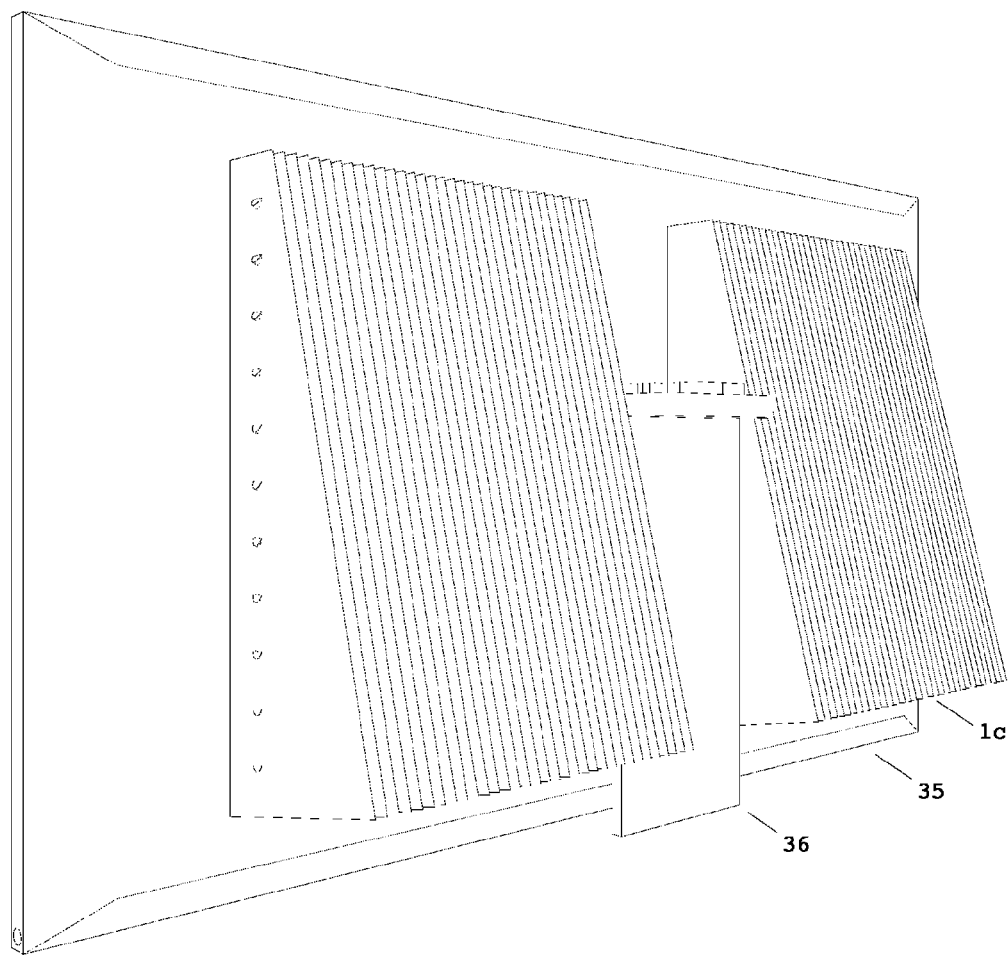
FIGS. 14 and 15 are perspective views of exemplary embodiment of FIG. 13, which shows how would the heat sink and back stand be utilized to make electromagnetic shielding, no matter how tilted the monitor is adjusted by user.
Figure 15:
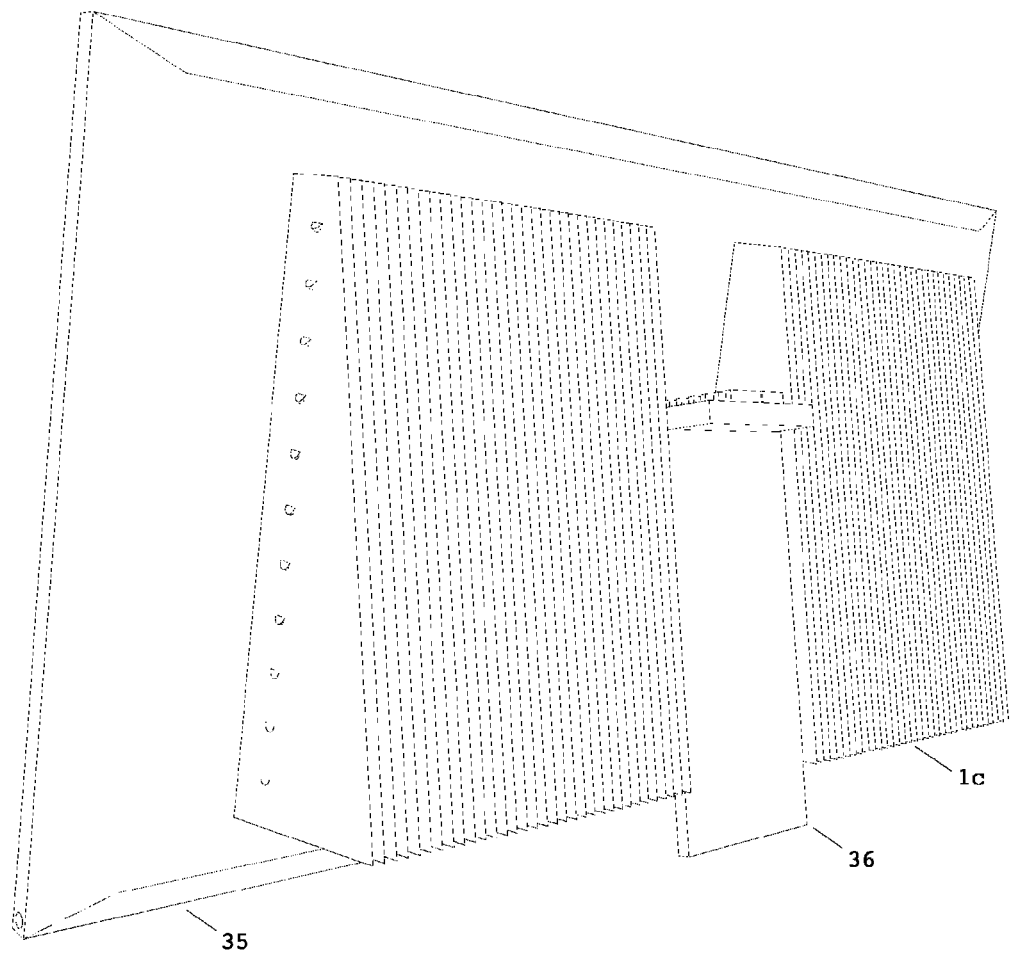

FIG. 13 to 15 shows the All-in-One (AIO) exemplary embodiment of the present invention. Monitor 35 provides DC power supply to the customized motherboard 2c and other electronic components.

Customized heat sink 1c and back stand 36 will be utilized for electromagnetic shielding, no matter how tilted the monitor will be adjusted by users, as shown in FIGS. 14 and 15.

Optional HDD bays (not shown) could be put in the bottom of customized heat sink 1c and back stand 36 to provide cheaper storages, and enclose the last open face of all electronic components. If the optional HDD bays were not provided, an metal vane (not shown) on back stand 36 will be utilized to work with customized heat sink 1c and back stand 36, to create electromagnetic shielding at the bottom.

Previous descriptions are only embodiments of the present invention and are not intended to limit the scope of the present invention. Many variations and modifications according to the claims and specification of the disclosure are still within the scope of the claimed invention. In addition, each of the embodiments and claims does not have to achieve all the advantages or characteristics disclosed. Moreover, the abstract and the title only serve to facilitate searching patent documents and are not intended in any way to limit the scope of the claimed invention.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

I claim:

1. A silent computer with portable RAID dock, comprising:
    a computer case to allow heat pipes and fins of heat sinks on a respective CPU/GPU to stick out of the computer case;
    an AC power supply unit (PSU) having heat pipes and fins of a heat sink sticking out of the PSU housing;

an external RAID dock to provide portable RAID and multiple whole Input/Output Operations Per Second (IOPS) performance of storage system;

a replaceable mating dock to be mounted on RAID drives;

a protective case to hold and enclose the RAID drives;

fans and manual switches/regulators which could be turned on manually for hours of compute intensive tasks;

graphics cards and adapter cables to convert the planes of graphics cards to be installed parallel to the plane of a motherboard and the plane of the computer case and hard disk drive (HDD) bays to provide cheaper storage.

2. The silent computer according to claim 1, wherein the computer case could be enclosed finally by either of two measures below:
   a. utilizing a top cover with a hole in center (looks like a square ring) to allow the heat pipes and fins of the heat sinks on the respective CPU/GPU to stick out of the computer case;
   b. utilizing a top cover which is integrated on the heat sink and fixate the motherboard from the bottom of the computer case.

3. The silent computer according to claim 1, wherein the RAID dock is replaceable and could be adapted to any types of mass storage interface.

4. The silent computer according to claim 1, wherein the mating dock could be replaced when its' design-life of matings is depleted.

* * * * *